United States Patent
Karbasian et al.

(10) Patent No.: US 12,261,037 B2
(45) Date of Patent: Mar. 25, 2025

(54) TUNABILITY OF DOPANT CONCENTRATION IN THIN HAFNIUM OXIDE FILMS

(71) Applicant: Applied Materials, Inc., Santa Clara, CA (US)

(72) Inventors: Golnaz Karbasian, San Jose, CA (US); Keith T. Wong, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 885 days.

(21) Appl. No.: 16/434,507

(22) Filed: Jun. 7, 2019

(65) Prior Publication Data
US 2019/0393029 A1 Dec. 26, 2019

Related U.S. Application Data

(60) Provisional application No. 62/688,120, filed on Jun. 21, 2018.

(51) Int. Cl.
H01L 21/02 (2006.01)
(52) U.S. Cl.
CPC .. *H01L 21/02181* (2013.01); *H01L 21/02205* (2013.01); *H01L 21/02274* (2013.01); *H01L 21/0228* (2013.01)
(58) Field of Classification Search
None
See application file for complete search history.

(56) References Cited

U.S. PATENT DOCUMENTS

| | | | |
|---|---|---|---|
| 7,135,421 B2 | 11/2006 | Ahn et al. | |
| 8,282,992 B2 * | 10/2012 | Myo | C23C 16/40 427/248.1 |
| 8,481,395 B2 | 7/2013 | Ahn et al. | |
| 9,659,864 B2 | 5/2017 | Wu et al. | |
| 2005/0170667 A1 * | 8/2005 | Conley, Jr. | H01L 21/28194 438/785 |
| 2006/0176645 A1 * | 8/2006 | Ahn | H01L 21/31645 361/311 |

(Continued)

FOREIGN PATENT DOCUMENTS

| | | |
|---|---|---|
| JP | 2007266464 A | 10/2007 |
| JP | 2013026276 A | 2/2013 |

(Continued)

OTHER PUBLICATIONS

Eschle, Joshua L., et al., "Annealing Study of ALD Deposited Ferroelectric Aluminum-doped Hafnium Oxide". 36th Annual Microelectronic Engineering Conference, Apr. 2018, pp. 1-6.*

(Continued)

*Primary Examiner* — Bret P Chen
(74) *Attorney, Agent, or Firm* — Servilla Whitney LLC (57) ABSTRACT

Methods of depositing thin films of hafnium oxide possessing strong ferroelectric properties are described. A hafnium oxide monolayer is formed in a first process cycle comprising sequential exposure of a substrate to a hafnium precursor, purge gas, first oxidant and purge gas. A doped hafnium oxide monolayer is formed in a second process cycle comprising sequential exposure of the substrate to a hafnium precursor, purge gas, dopant precursor, purge gas, second oxidant and purge gas. Thin films of hafnium oxide are also described.

17 Claims, 5 Drawing Sheets

(56) References Cited

U.S. PATENT DOCUMENTS

| | | | |
|---|---|---|---|
| 2006/0257563 A1* | 11/2006 | Doh | C23C 16/45531 427/248.1 |
| 2007/0048953 A1 | 3/2007 | Gealy et al. | |
| 2007/0232501 A1 | 10/2007 | Tonomura | |
| 2008/0182427 A1 | 7/2008 | Oberbeck et al. | |
| 2008/0261413 A1* | 10/2008 | Mahajani | C23C 16/0218 438/785 |
| 2009/0162551 A1 | 6/2009 | Zilbauer et al. | |
| 2012/0270409 A1 | 10/2012 | Kim et al. | |
| 2013/0210193 A1 | 8/2013 | Lee et al. | |
| 2015/0076437 A1 | 3/2015 | Tao et al. | |
| 2017/0004967 A1* | 1/2017 | Kil | H01L 21/02362 |
| 2017/0103988 A1 | 4/2017 | Nishida et al. | |
| 2018/0108587 A1 | 4/2018 | Jiang et al. | |
| 2018/0265967 A1* | 9/2018 | Lei | C23C 16/45536 |
| 2022/0282367 A1* | 9/2022 | Macdonald | C23C 16/45553 |

FOREIGN PATENT DOCUMENTS

| | | |
|---|---|---|
| KR | 20070015958 A | 2/2007 |
| KR | 20150037009 A | 4/2015 |
| WO | 2005113855 A1 | 12/2005 |

OTHER PUBLICATIONS

Yoo, Yeon Woo, et al., "Structure and Electrical Properties of Al-Doped HfO2 and ZrO2 Films Grown via Atomic Layer Deposition on Mo Electrodes". ACS Appl. Mater. Interfaces 2014, 6, 22474-22482.*

Pal, Ashish, et al., "Enhancing ferroelectricity in dopant-free hafnium oxide". Applied Physics Letters, 110, 022903 (2017), pp. 1-4.*

Kim, Dae-Hyun , et al., "Interaction of TEMAHf Precursor with OH-Terminated Si (001) Surface: A First Principles Study", Journal of Nanoscience and Nanotechnology, vol. 11, 4324-4327, 2011.

Kobayashi, Masaharu , et al., "On device design for steep-slope negative-capacitance field-effect-transistor operating at sub-0.2V supply voltage with ferroelectric HfO2 thin film", AIP Advances 6, 025113 (2016), 11 pages.

Krivokapic, Z. , et al., "14nm Ferroelectric FinFET Technology with Steep Subthreshold Slope for Ultra Low Power Applications", IEEE (2017), PID119-8936, 4 pages.

Lee, M. H., et al., "Ferroelectric Al:HfO2 Negative Capacitance FETs", IEEE (2017), IEDM17 565-568.

Mueller, Stefan , et al., "Incipient Ferroelectricity in Al-Doped HfO2 Thin Films", Adv. Funct. Mater. 2012, 22, pp. 2412-2417.

Oh, Nam Khen, et al., "The Effects of Thermal Decomposition of Tetrakis-ethylmethylaminohafnium (TEMAHf) Precursors on HfO2 Film Growth using Atomic Layer Deposition", Appl. Sci. Converg. Technol. 25(3): 56-60 (2016).

PCT International Search Report and Written Opinion in PCT/US2017/035924 dated Sep. 27, 2019, 12 pages.

Martin, Dominik , et al., "Ferroelectricity in Si-Doped Hf02 Revealed: A Binary Lead-Free Ferroelectric", Adv. Mater. 2014, 26, pp. 8198-8202.

Machine translation of KR20070015958A.

* cited by examiner

TUNABILITY OF DOPANT CONCENTRATION IN THIN HAFNIUM OXIDE FILMS

CROSS-REFERENCE TO RELATED APPLICATIONS

This application claims priority to U.S. Provisional Application No. 62/688,120, filed Jun. 21, 2018, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure provide thin doped-hafnium oxide films where the amount of dopant can be particularly controlled.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

The negative capacitance FET (NCFET) has been proposed as an alternative transistor. NCFET has the same structure as MOSFET except that a ferroelectric thin film is used as a gate insulator. When a ferroelectric material is used as a gate insulator, negative capacitance may result.

Hafnium oxide doped films exhibit ferroelectric properties that are sensitive to the concentration of dopant. For thin films down to 2 nm in thickness, the total number of $HfO_2$ monolayers and dopant monolayers does not exceed 20-30. If the $HfO_2$ film is doped by inserting nearly complete monolayers of the dopant film, as is typically the case for atomic layer deposition (ALD), the concentration of dopants in these stacks, thus, will be integer multiples of approximately 3-5 mol %. Consequently, the conventional method of adding dopants, monolayer-by-monolayer, results in few achievable doping levels in a range of 1-10 mol % that is needed to achieve ferroelectricity in most doped hafnium oxide films. Thus, there is a need for finely controlling/tuning the dopant concentration, and, hence, the ferroelectricity, of thin films.

SUMMARY

Apparatuses and methods to manufacture integrated circuits are described. In one or more embodiments, a method of depositing a film is described. In one embodiment, a first deposition cycle comprises exposing a substrate in a processing chamber to a hafnium precursor to deposit a hafnium-containing monolayer, purging the processing chamber of the hafnium precursor, exposing the substrate to a first oxidant to react with the hafnium-containing monolayer to form a hafnium oxide monolayer, and purging the processing chamber of the first oxidant. A second deposition cycle comprises exposing the substrate in a processing chamber to a hafnium precursor to deposit a second hafnium-containing monolayer, purging the processing chamber of the hafnium precursor; exposing the substrate to a dopant precursor to deposit a dopant-containing layer on the substrate with the second hafnium-containing monolayer, purging the processing chamber of the dopant precursor, exposing the substrate to a second oxidant to react with the hafnium-containing monolayer and the dopant-containing layer to form a doped hafnium oxide film on the substrate, and purging the substrate of the second oxidant.

In one or more embodiments, a method of depositing a film is described. A hafnium oxide monolayer is formed in a first process cycle comprising sequential exposure of a substrate to a hafnium precursor, purge gas, first oxidant and purge gas. A doped hafnium oxide monolayer is formed in a second process cycle comprising sequential exposure of the substrate to a hafnium precursor, purge gas, dopant precursor, purge gas, second oxidant and purge gas. One or more of the first process cycle or the second process cycle are repeated to form a doped hafnium oxide film having a thickness of about 0.5 to about 10 nm.

In one or more embodiments, a thin film on a substrate is described. The thin film comprises less than or equal to about 50 monolayers of $HfO_2$ doped with a dopant comprising one or more of aluminum (Al), silicon (Si), zirconium (Zr), yttrium (Y), lanthanum (La), gadolinium (Gd), or strontium (Sr). The dopant is present in an amount in a range of about 1 mol % to about 9 mol %, wherein the thin film has a remanent polarization of about 10 to about 50 $\mu C\ cm^{-2}$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. The negative capacitance field-effect transistor (NCFET) has the same structure as MOSFET except that a ferroelectric thin film (or a stack of ferroelectric/dielectric film) is used as a gate insulator. When a ferroelectric material is used as a gate insulator, negative capacitance FET may result. In one or more embodiments, hafnium oxide thin films advantageously possess ferroelectric properties, particularly when a dopant (e.g. aluminum) is incorporated into the host lattice.

As used herein, the term "ferroelectric properties" refers to a characteristic of materials that have a spontaneous electric polarization that can be reversed by the application of an external electric field.

The composite thin films of one or more embodiments, which are fabricated by ALD, have numerous applications, including, but not limited to, logic and memory applications. More particularly, thin films, such as hafnium oxide ($HfO_2$) doped with a dopant (e.g. $ZrO_2$, $Al_2O_3$, $Y_2O_3$, and the like) exhibit ferroelectric properties which are of great interest for low power logic and memory applications.

Conventionally, a doped-hafnium oxide ALD film is formed by a [A-B]-[C-B] deposition process. Conventionally, a hafnium oxide monolayer is formed in a first process cycle comprising sequential exposure of a substrate to a hafnium precursor, purge gas, first oxidant, and purge gas. A doped hafnium oxide monolayer is formed in a second process cycle comprising sequential exposure of the substrate to a dopant precursor, purge gas, second oxidant and purge gas. One or more of the first process cycle or the second process cycle can be repeated to form a film.

A second conventional process involves co-flowing the hafnium precursor and dopant precursor, in an [AC]-[B] process. Specifically, a doped hafnium oxide monolayer is formed by exposure of the substrate to both a hafnium precursor and a dopant precursor, followed sequentially by purge gas, an oxidant, and purge gas.

The ferroelectricity of most doped hafnium oxide ($HfO_2$) films reach their maximum at about 4 mol % to about 9 mol % of dopant. The ferroelectricity drastically and abruptly decreases for lower and higher dopant concentration levels.

Embodiments described herein advantageously provide doped hafnium oxide films which have the ability to have finely controlled/tuned dopant concentration. The tunability of dopants in the thin films according to one or more embodiments significantly improves by changing the dopant concentration in each monolayer. This dopant adjustability, in turn, advantageously provides superior control over the ferroelectricity of the doped hafnium oxide film. Particularly, embodiments provide dopant adjustability down to about 1.5 mol % in thin films (i.e. films having a thickness of about 2 nm and comprising about 30 monolayers).

Without intending to be bound by theory, it is thought that the significance of the method of one or more embodiments described herein is that for very thin films, 2 nm or up to 30 cycles, this method can advantageously achieve multiple concentrations (increments of 1.5 mol %) in the range of about 1.5 to about 9 mol %, enabling fine tuning of ferroelectric film properties.

For the doped hafnium oxide ($HfO_2$) films of one or more embodiments, each dopant-containing layer involves pulsing and purging a hafnium containing precursor prior to pulsing and purging the dopant precursor, followed by an oxidant pulse. As a result, less than 100% of each dopant-containing layer is composed of dopant.

In one or more embodiments, a method of depositing a film is described. In one embodiment, a first deposition cycle comprises exposing a substrate in a processing chamber to a hafnium precursor to deposit a hafnium-containing monolayer, purging the processing chamber of the hafnium precursor, exposing the substrate to a first oxidant to react with the hafnium-containing monolayer to form a hafnium oxide monolayer, and purging the processing chamber of the first oxidant. A second deposition cycle comprises exposing the substrate in a processing chamber to a hafnium precursor to deposit a second hafnium-containing layer, purging the processing chamber of the hafnium precursor; exposing the substrate to a dopant precursor to deposit a dopant-containing layer on the substrate with the second hafnium-containing layer, purging the processing chamber of the dopant precursor, exposing the substrate to a second oxidant to react with the hafnium-containing monolayer and the dopant-containing layer to form a doped hafnium oxide monolayer on the substrate, and purging the substrate of the second oxidant.

Figure 1:
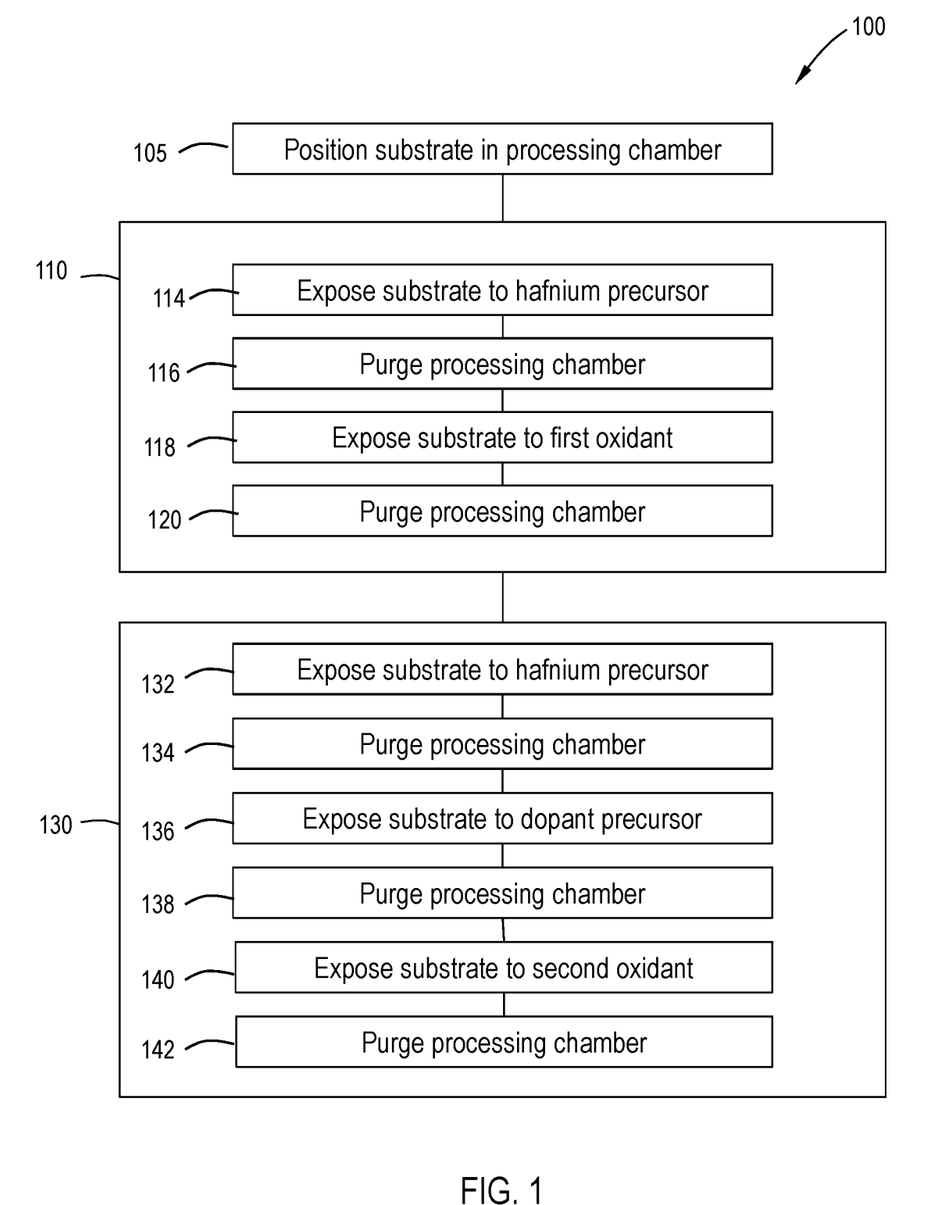
FIG. 1 depicts a flow process diagram of one embodiment of a method of forming a thin film according to embodiments described herein.

FIG. 1 depicts a flow diagram of a method 100 of depositing a film in accordance with one or more embodiments of the present disclosure. With reference to FIG. 1, the method 100 comprises a first deposition cycle 110 and a second deposition cycle 130. The method 100 begins at operation 105 by positioning a substrate into a processing chamber.

The substrate may be any substrate known to one of skill in the art. In one or more embodiments, the substrate comprises one or more of silicon (Si), silicon oxide ($SiO_2$), germanium (Ge), silicon germanium (SiGe), molybdenum disulfide ($MoS_2$), molybdenum diselenide ($MoSe_2$), tungsten disulfide ($WS_2$), tungsten diselenide ($WSe_2$), titanium nitride (TiN), tantalum nitride (TaN), tungsten (W), platinum (Pt), or iridium (Ir).

At operation 114, the substrate is exposed in the processing chamber to a hafnium precursor to deposit a hafnium-containing monolayer.

In one or more embodiments, the hafnium precursor is selected from one or more of tetrakis(ethylmethylamido) hafnium(IV) (TEMAHf), tetrakis(dimethylamido) hafnium (IV) (TDMAHf), tetrakis(diethylamido)hafnium(IV) (TDEAHf), hafnium tetrachloride ($HfCl_4$), hafnium isopropoxide isopropanol adduct, hafnium (IV) tert-butoxide, dimethylbis(cyclopentadienyl)hafnium (IV), bis(trimethylsily) amidohafnium (IV) chloride, bis(methyl-$\eta^5$-cyclopentadienyl)methoxymethylhafnium, or bis(methyl-$\eta^5$-cyclopentadienyl)dimethylhafnium.

At operation 116, the processing chamber is purged of the hafnium precursor. Purging can be accomplished with any suitable gas that is not reactive with the substrate, film on the substrate and/or processing chamber walls. Suitable purge gases include, but are not limited to, $N_2$, He and Ar.

At operation 118, the substrate is exposed to a first oxidant to react with the hafnium-containing monolayer to form a hafnium oxide monolayer. In one or more embodiments, the first oxidant is selected from water ($H_2O$), molecular oxygen ($O_2$), ozone ($O_3$), direct $O_2$ plasma, or remote $O_2$ plasma. At operation 120, the processing chamber is purged of the first oxidant.

The second deposition cycle 130 begins at operation 132 by exposing the substrate in a processing chamber to a hafnium precursor to deposit a second hafnium-containing monolayer.

In one or more embodiments, the hafnium precursor is selected from one or more of tetrakis(ethylmethylamido) hafnium(IV) (TEMAHf), tetrakis(dimethylamido) hafnium (IV) (TDMAHf), tetrakis(diethylamido)hafnium(IV) (TDEAHf), hafnium tetrachloride ($HfCl_4$), hafnium isopropoxide isopropanol adduct, hafnium (IV) tert-butoxide, dimethylbis(cyclopentadienyl)hafnium (IV), bis(trimethylsily) amidohafnium (IV) chloride, bis(methyl-$\eta^5$-cyclopentadienyl)methoxymethylhafnium, or bis(methyl-$\eta^5$-cyclopentadienyl)dimethylhafnium.

As recognized by one of skill in the art, the hafnium precursor utilized in the second deposition cycle may be the same precursor that is used in the first deposition cycle, or the hafnium precursor may be a different precursor. In one or more embodiments, the hafnium precursor used in the first deposition cycle is the same hafnium precursor used in the second deposition cycle.

At operation 134, the processing chamber is purged of the hafnium precursor. At operation 136, the substrate is exposed to a dopant precursor to deposit a dopant-containing layer on the substrate with the second hafnium-containing monolayer.

In one or more embodiments, the dopant is selected from one or more of aluminum (Al), silicon (Si), zirconium (Zr), yttrium (Y), lanthanum (La), gadolinium (Gd), or strontium (Sr). In one or more embodiments, the dopant is selected from one or more of aluminum oxide, silicon oxide, zirconium oxide, yttrium oxide, lanthanum oxide, gadolinium oxide, or strontium oxide.

In one or more embodiments, the dopant precursor is selected from one or more of trimethylaluminum (TMA), triethylaluminum(TEA), aluminum chloride ($AlCl_3$), silicon tetrachloride ($SiCl_4$), hexachlorodisilane ($Si_2Cl_6$), bis(diethylamino)silane, tris(dimethylamino)silane, tris(isopropylcyclopentadienyl)lanthanum, tris(2,2,6,6-tetramethyl-3,5-heptanedionato)lanthanum (III) ($La(thd)_3$), tris(cyclopentayldienyl)lanthanum (III) ($LaCp_3$), tris(isopropylcyclopentadienyl)lanthanum (III) ($La(CpiPr)_3$), tetrakis(ethylmethylamido)zirconium(IV) (TEMAZr), tetrakis(dimethylamido) zirconium(IV) (TDMAZr), tetrakis(2,2,6,6,-tetramethyl-3,5-heptanedionate)zirconium, zirconium (IV) 2-ethylhexanoate, zirconium(IV) dibutoxide(bis-2,4-pentanedionate), tetrakis(diethylamido)zirconium(IV) (TDEAZr), dimethyl-bis(pentamethylcyclopentadienyl)zirconium(IV), bis(methyl-η5-cyclopentadienyl) methoxymethylzirconium, bis(cyclopentadienyl)zirconium(IV) dihydride, zirconium tetrachloride ($ZrCl_4$), tris(cyclopentyldienyl)yttrium (III) ($YCp_3$), tris(methylcyclopentadienyl)yttrium(III) (($MeCp)_3Y$), tris(ethylcyclopentadienyl)yttrium(III) (($EtCp)_3Y$), tris(2,2,6,6-tetramethyl-3,5-heptanedionato)yttrium(III) ($Y(thd)_3$), tris(2,2,6,6-tetramethyl-3,5-heptanedionato)gadolinium(III) ($Gd(thd)_3$), tris(methylcyclopentadienyl) gadolinium (III) (($MeCp)_3Gd$), tris(ethylcyclopentadienyl)gadolinium(III) (($EtCp)_3Gd$), bis(triisopropylcyclopentadienyl)strontium (II) (($i-Pr_3Cp)_2Sr$), bis(trimethyl-n-propylcyclopentadienyl) strontium(II) (($n-PrMe_3Cp)_2Sr$), or bis(methylcyclopentadienyl) strontium(II) ($Sr(thd)_2$).

At operation 138, the processing chamber is purged of the dopant precursor. At operation 140, the substrate is exposed to a second oxidant to react with the hafnium-containing and dopant-containing species forming the doped hafnium-containing layer to form a doped hafnium oxide film on the substrate.

In one or more embodiment, the second oxidant is selected from $H_2O$, molecular oxygen ($O_2$), ozone ($O_3$), direct $O_2$ plasma, or remote $O_2$ plasma. As recognized by one of skill in the art, the oxidant utilized in the second deposition cycle may be the same oxidant that is used in the first deposition cycle, or the oxidant used in the second deposition cycle may be a different oxidant than that used in the first deposition cycle. In one or more embodiments, the first oxidant and the second oxidant are independently selected from $H_2O$, molecular oxygen ($O_2$), ozone ($O_3$), direct $O_2$ plasma, or remote $O_2$ plasma. In one or more embodiments, the oxidant used in the first deposition cycle is the same oxidant used in the second deposition cycle.

At operation 142, the substrate is purged of the second oxidant.

As recognized by one skilled in the art, purging the processing chamber comprises flowing a purge gas over the substrate. In one or more embodiments, the purge gas is selected from one or more of Ar, $N_2$, or He. The purge gas may be used to purge the processing chamber of the hafnium precursor, the first oxidant, the dopant precursor, or the second oxidant. In some embodiments, the same purge gas is used for each purging operation. In other embodiments, a different purge gas is used for the various purging operations.

With reference to FIGS. 2A-2F, one or more embodiments are directed to a film stack 200. In some embodiments, the film stack 200 is part of a gate stack in a negative capacitance field-effect transistor (NCFET).

The film stack 200 is formed on substrate 210, which can be any suitable material or shape. In the embodiment illustrated, the substrate 210 is a flat surface and the film stack 200 is represented by rectangular boxes. However, those skilled in the art will understand that the substrate 210 can have one or more features (e.g., trenches or vias) and that the film stack 200 can be formed to conform to the shape of the substrate 210 surface.

In one or more embodiments, the substrate 210 comprises one or more of silicon (Si), silicon oxide ($SiO_2$), germanium (Ge), silicon germanium (SiGe), molybdenum disulfide ($MoS_2$), molybdenum diselenide ($MoSe_2$), tungsten disulfide ($WS_2$), tungsten diselenide ($WSe_2$), titanium nitride (TiN), tantalum nitride (TaN), platinum (Pt), iridium (Ir), or tungsten (W).

In one or more embodiments, the substrate 210 comprises a silicon wafer or silicon fin with 0.5-2 nm silicon oxide interlayer dielectric.

Figure 2A:
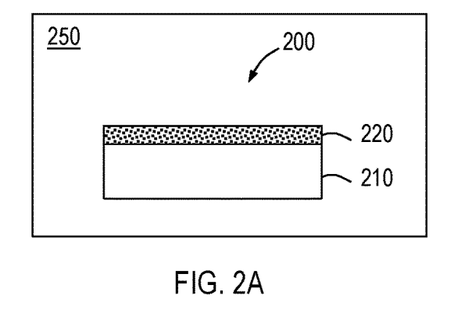
FIG. 2A illustrates a cross-sectional view of a substrate according to one or more embodiments.

In one or more embodiment, during a first deposition cycle the substrate 210 is placed in a processing chamber 250 and is exposed to a hafnium precursor to deposit a hafnium-containing monolayer 220 on the substrate 210, as shown in FIG. 2A. The hafnium precursor can be any suitable hafnium precursor including, but not limited to, the hafnium precursors described with respect to the method of FIG. 1.

The processing chamber 250 is purged of the hafnium precursor. In one or more embodiments, purging the processing chamber 250 comprises flowing a purge gas (not shown) over the substrate 210. In one or more embodiments, the purge gas is selected from one or more of Ar, $N_2$, or He.

Figure 2B:
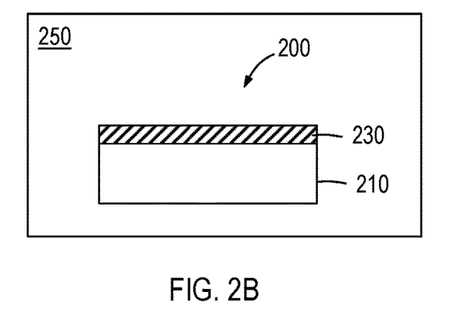
FIG. 2B illustrates a cross-sectional view of a substrate according to one or more embodiments.

Referring to FIG. 2B, the substrate 210 is exposed in the processing chamber 250 to a first oxidant (not shown) to react with the hafnium-containing monolayer 220 to form a hafnium oxide monolayer 230. In one or more embodiments, the first oxidant is selected from $H_2O$, molecular oxygen ($O_2$), ozone ($O_3$), direct $O_2$ plasma, or remote $O_2$ plasma. The processing chamber 250 is then purged of the first oxidant.

Figure 2C:
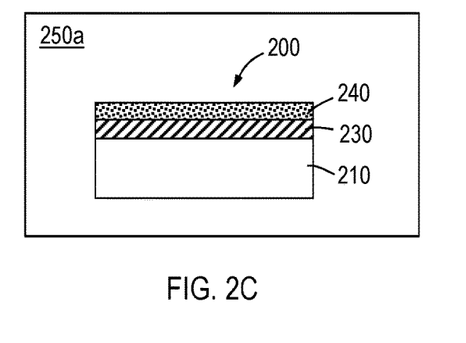
FIG. 2C illustrates a cross-sectional view of a substrate according to one or more embodiments.

Referring to FIG. 2C, in a second deposition cycle, the substrate 210 is exposed, in a processing chamber 250a, to a hafnium precursor to deposit a second hafnium-containing monolayer 240. As recognized by one of skill in the art, the processing chamber 250 utilized in the first deposition cycle may by the same or different than the processing chamber 250a utilized in the second deposition cycle. In one or more embodiments, the processing chamber utilized in the first deposition cycle is the same processing chamber utilized in the second deposition cycle. In one or more embodiments, the processing chamber utilized in the first deposition cycle is a different processing chamber than the processing chamber utilized in the second deposition cycle. The processing chamber 250a is then purged of the hafnium precursor. In one or more embodiments, purging the processing chamber 250a comprises flowing a purge gas (not shown) over the substrate 210. In one or more embodiments, the purge gas is selected from one or more of Ar, $N_2$, or He.

Figure 2D:
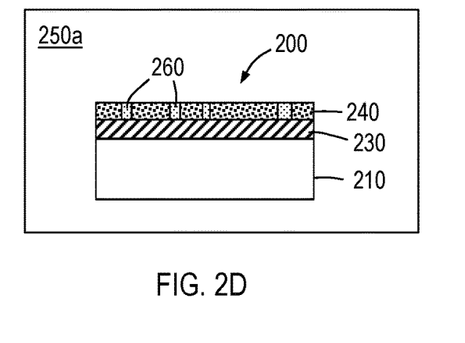
FIG. 2D illustrates a cross-sectional view of a substrate according to one or more embodiments.
Figure 3A:
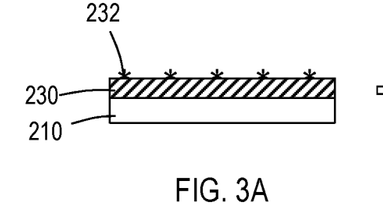
FIG. 3A illustrates a cross-sectional view of a substrate according to one or more embodiments.
Figure 3B:
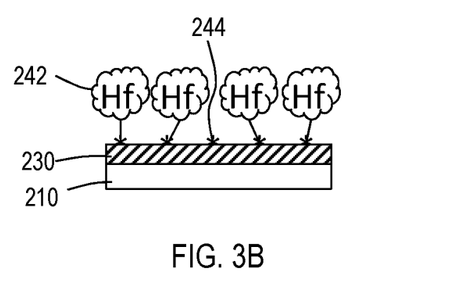
FIG. 3B illustrates a cross-sectional view of a substrate according to one or more embodiments.
Figure 3C:
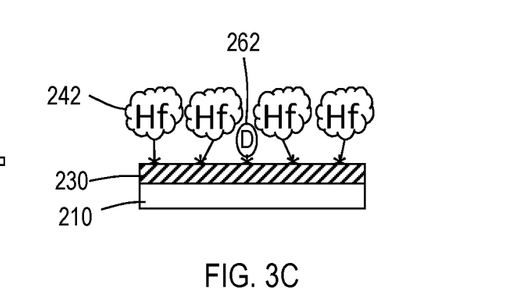
FIG. 3C illustrates a cross-sectional view of a substrate according to one or more embodiments.
Figure 3D:
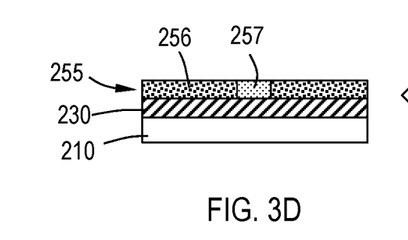
FIG. 3D illustrates a cross-sectional view of a substrate according to one or more embodiments.

Referring to FIG. 2D, the substrate 210 is exposed, in a processing chamber 250a, to a dopant precursor to deposit a dopant-containing layer 260 on the substrate 210 with the second hafnium-containing monolayer 240. With reference to FIGS. 3A through 3D, and without intending to be bound by theory, it is thought that the dopant precursor does not react with the hafnium precursor, but instead either adsorbs in sites not reacted during the hafnium pulse or displaces some of the adsorbed hafnium precursor. FIG. 3A shows the substrate 210 with hafnium oxide monolayer 230. A number of active sites 232 are available on the surface of the hafnium oxide monolayer 230. While the active sites 232 are shown evenly spaced, the skilled artisan will recognize that this is merely for descriptive purposes. In FIG. 3B, the hafnium precursor has been exposed to the substrate 210 and a hafnium species 242 chemisorbs to the active sites 232. While the reaction of the hafnium precursor with the substrate surface is self-limiting, at least some of the active sites 244 remain available but inaccessible to the hafnium precursor (e.g., by steric hindrance). In FIG. 3C, the dopant precursor has been exposed to the substrate 210 and binds with the available active sites 244 to form a dopant species 262 on the surface with the hafnium species 242. Upon oxidation, as shown in FIG. 3D, the hafnium species 242 and dopant species 262 become oxidized to form a doped hafnium oxide film 255. The doped hafnium oxide film 255 is illustrated as a conglomeration of a hafnium oxide film 256 and a dopant oxide film 257. In one or more embodiments, the doped hafnium oxide film 255 comprises or consists essentially of about 40 mol % aluminum dopant. The doped hafnium oxide film 270 can have many of these doped hafnium oxide film 255 layers and, hence, the concentration of the film stack 200 can be adjusted from increments of about 1.5 mol % dopant concentration up to about 40 mol %. While discrete boundaries are illustrated, the skilled artisan will recognize that the dopant atom, hafnium atoms and oxygen atoms are dispersed randomly throughout the doped hafnium oxide film 255.

The aluminum-containing layer of one or more embodiments contains from about 1 mol % to about 9 mol % aluminum oxide ($Al_2O_3$). The mol % can be measured by any mechanism known to one of skill in the art. For example, the mol % can be measured by, but not limited to, one or more of X-ray photoelectron spectroscopy (XPS), atomic emission spectrometry (AES), secondary ion mass spectrometry (SIMS), Rutherford backscatter spectrometry (RBS), energy dispersive x-ray spectroscopy (EDX), or electron energy loss spectroscopy (EELS).

The processing chamber 250a is then purged of the dopant precursor. As described above, in one or more embodiments, purging the processing chamber 250a comprises flowing a purge gas (not shown) over the substrate 210. In one or more embodiments, the purge gas is selected from one or more of Ar, $N_2$, or He.

Figure 2E:
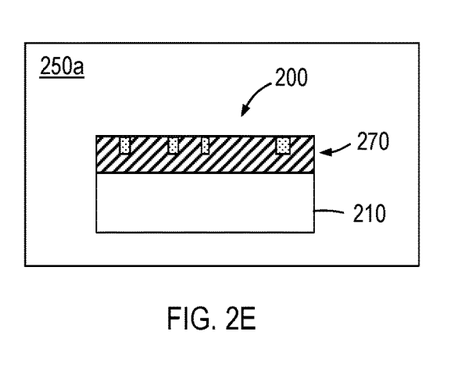
FIG. 2E illustrates a cross-sectional view of a substrate according to one or more embodiments.

Referring to FIG. 2E, the substrate 210 is exposed, in a processing chamber 250a, to a second oxidant to react with the second hafnium-containing monolayer 240 and the dopant-containing layer 260 to form a doped hafnium oxide film 270 on the substrate 210. In one or more embodiments, the second oxidant is selected from $H_2O$, molecular oxygen ($O_2$), ozone ($O_3$), direct $O_2$ plasma, or remote $O_2$ plasma. The processing chamber 250a is then purged of the second oxidant. As described above, in one or more embodiments, purging the processing chamber 250a comprises flowing a purge gas (not shown) over the substrate 210. In one or more embodiments, the purge gas is selected from one or more of Ar, $N_2$, or He.

As recognized by one of skill in the art, the oxidant utilized in the second deposition cycle may be the same oxidant that is used in the first deposition cycle, or the oxidant used in the second deposition cycle may be a different oxidant than that used in the first deposition cycle.

In one or more embodiments, the doped hafnium oxide film 270 comprises from about 1 mol % to about 40 mol % dopant. In one or more specifc embodiments, the doped hafnium oxide film 270 comprises from about 1 mol % to about 9 mol % dopant. The mol % is a measurement of the amount of dopant, in the oxide form, present in the doped hafnium oxide film. For example, in one or more embodiments, the dopant comprises aluminum (Al), and the doped-hafnium oxide film is an aluminum-doped hafnium oxide film. The aluminum-doped hafnium oxide film of one or more embodiments contains from about 1 mol % to about 40 mol % aluminum oxide ($Al_2O_3$). The aluminum-doped hafnium oxide film of one or more specific embodiments contains from about 1 mol % to about 9 mol % aluminum oxide ($Al_2O_3$). The mol % can be measured by any mechanism known to one of skill in the art. For example, the mol % can be measured by, but not limited to, one or more of X-ray photoelectron spectroscopy (XPS), atomic emission spectroscopy (AES), secondary ion mass spectrometry (SIMS), Rutherford backscatter spectrometry (RBS), energy dispersive x-ray spectroscopy (EDX), or electron energy loss spectroscopy (EELS).

In one or more embodiments, the doped-hafnium oxide film 270 has a thickness in the range of about 0.5 nm to about 10 nm, including about 0.5 nm to about 8 nm, about 0.5 nm to about 7 nm, about 0.5 nm to about 6 nm, about 0.5 nm to about 5 nm, about 0.5 to about 4 nm, about 0.5 to about 3 nm, and about 0.5 to about 2 nm. In some embodiments, the doped-hafnium oxide film has a thickness of less than about 10 nm, including less than about 9 nm, less than about 8 nm, less than about 7 nm, less than about 6 nm, less than about 5 nm, less than about 4 nm, less than about 3 nm, and less than about 2 nm. In some embodiments, the doped-hafnium oxide film has a thickness of about 0.5 nm, about 1 nm, about 1.5 nm, about 2 nm, about 2.5 nm, about 3 nm, about 3.5 nm, about 4 nm, about 4.5 nm, about 5 nm, about 5.5 nm, about 6 nm, about 6.5 nm, about 7 nm, about 7.5 nm, about 8 nm, about 8.5 nm, about 9 nm, about 9.5 nm, and about 10 nm.

In one or more embodiments, the doped-hafnium oxide film has less than or equal to about 150 total monolayers, including less than or equal to about 140 total monolayers, including less than or equal to about 130 total monolayers, less than or equal to about 120 total monolayers, less than or equal to about 110 total monolayers, less than or equal to about 100 total monolayers, less than or equal to about 90 total monolayers, less than or equal to about 80 total monolayers, less than or equal to about 70 total monolayers, less than or equal to about 60 total monolayers, 50 total monolayers, including less than or equal to about 45 total monolayers, less than or equal to about 40 total monolayers, less than or equal to about 35 total monolayers, less than or equal to about 30 total monolayers, less than or equal to about 25 total monolayers, or less than or equal to about 20 total monolayers.

Figure 2F:
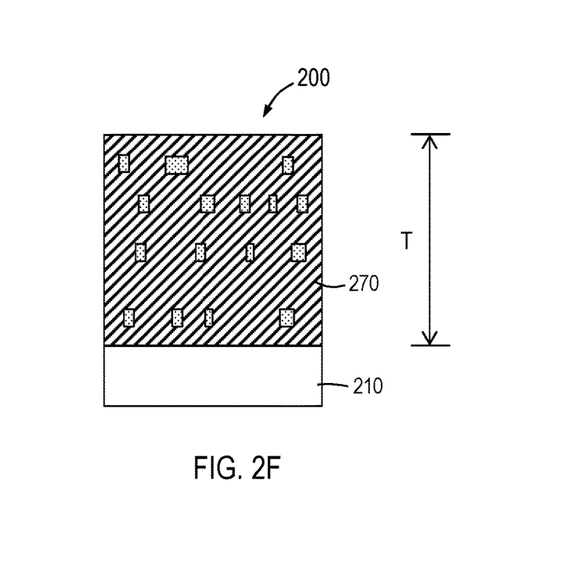
FIG. 2F illustrates a cross-sectional view of a substrate according to one or more embodiments.

Referring to FIG. 2F, the method may comprise repeating one or more of the first deposition cycle or the second deposition cycle to form a doped hafnium oxide film 270 having a thickness T of about 0.5 to about 10 nm, and having less than or equal to about 150 total monolayers.

Referring to FIGS. 2A-2F, in one or more embodiments, a method of depositing a film comprises forming a hafnium oxide monolayer 230 in a first process cycle comprising sequential exposure of a substrate 210 to a hafnium precursor, purge gas, first oxidant and purge gas. A doped hafnium oxide film 270 is formed in a second process cycle comprising sequential exposure of the substrate 210 to a hafnium precursor, purge gas, dopant precursor, purge gas, second oxidant and purge gas. One or more of the first process cycle or the second process cycle may be repeated to form a doped hafnium oxide film having a thickness of about 0.5 nm to about 10 nm.

One or more embodiments are directed to a thin film, also known as a film stack. In some embodiments, the thin film is part of a gate stack in a negative capacitance field-effect transistor (NCFET). In one or more embodiments, the thin comprises less than or equal to about 30 monolayers of $HfO_2$ doped with a dopant comprising one or more of aluminum (Al), silicon (Si), zirconium (Zr), yttrium (Y), lanthanum (La), gadolinium (Gd), or strontium (Sr), the dopant present in an amount in a range of about 2 mol % to about 9 mol %, wherein the thin film has a remanent polarization of about 10 to about 50 $\mu C\ cm^{-2}$.

In one or more embodiments, the thin film has a remanent polarization of about 10 to about 50 $\mu C\ cm^{-2}$, including about 10 $\mu C\ cm^{-2}$, about 15 $\mu C\ cm^{-2}$, about 20 $\mu C\ cm^{-2}$, about 25 $\mu C\ cm^{-2}$, about 30 $\mu C\ cm^{-2}$, about 35 $\mu C\ cm^{-2}$, about 40 $\mu C\ cm^{-2}$, about 45 $\mu C\ cm^{-2}$, and about 50 $\mu C\ cm^{-2}$.

The thin film contains from 1 mol % to about 40 mol % of dopant, in total. In one or more specific embodiments, the thin film comprises less than about 30 monolayers of hafnium oxide ($HfO_2$) doped with aluminum oxide, and the aluminum oxide is present in an amount of about 4 mol % to about 8 mol %. The thin film has a thickness in the range of about 0.5 nm to about 10 nm.

Figure 4:
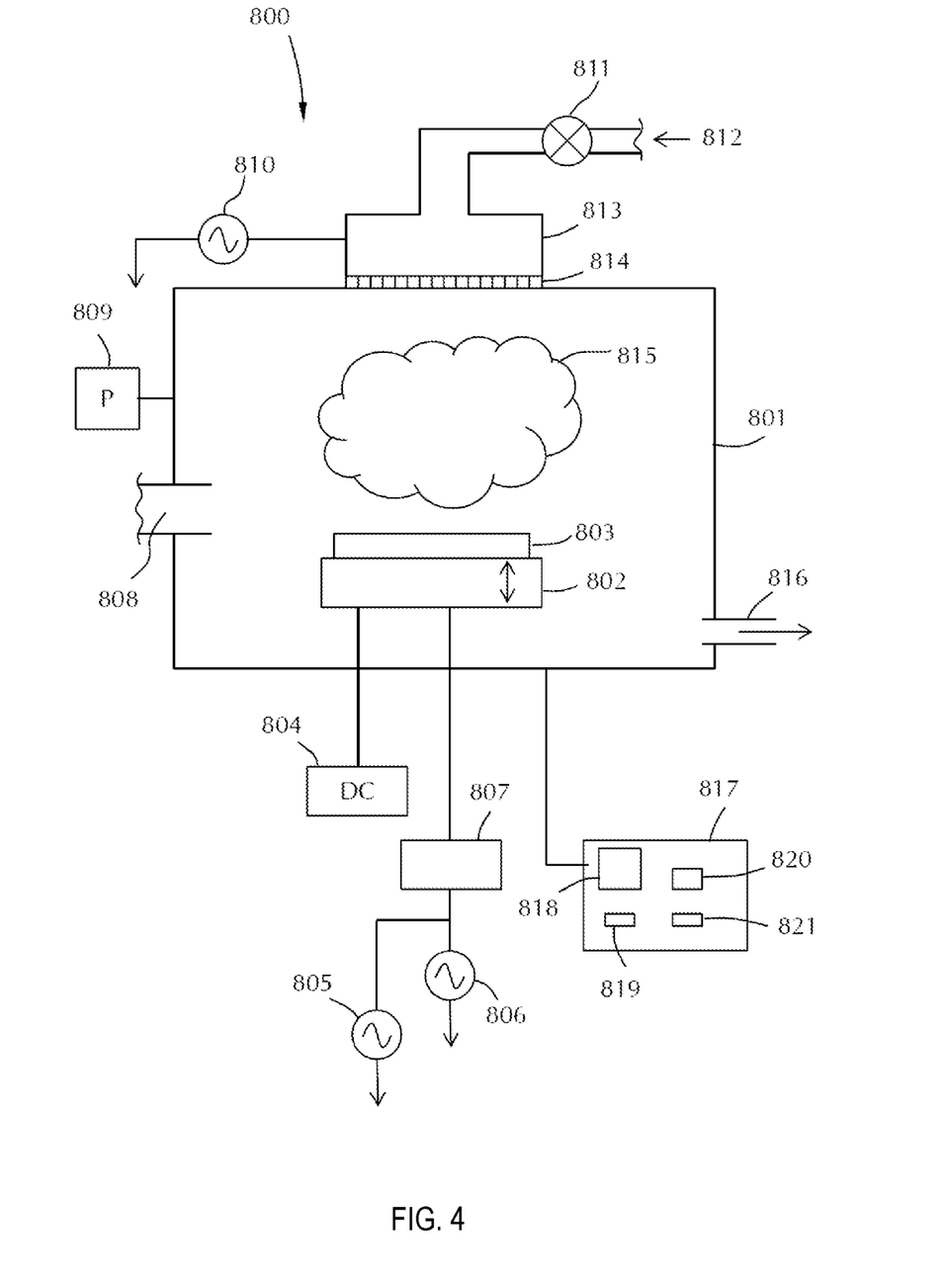
FIG. 4 is a block diagram of a process chamber in accordance with one or more embodiment of the disclosure.

FIG. 4 shows a block diagram of a plasma system 800 to perform at least some of the method of one or more embodiments. The plasma system 800 illustrated has a processing chamber 801. A movable pedestal 802 to hold a substrate 803 that has been positioned in processing chamber 801. Pedestal 802 can comprise an electrostatic chuck ("ESC"), a DC electrode embedded into the ESC, and a cooling/heating base. In an embodiment, pedestal 802 acts as a moving cathode. In an embodiment, the ESC comprises an $Al_2O_3$ material, $Y_2O_3$, or other ceramic materials known to one of ordinary skill of electronic device manufacturing. A DC power supply 804 can be connected to the DC electrode of the pedestal 802. In some embodiments, the pedestal 802 includes a heater (not shown) that is capable of raising the temperature of the substrate to the first temperature. While an electrostatic chuck is illustrated as the pedestal 802, those skilled in the art will understand that this is merely exemplary and other pedestal types are within the scope of the disclosure.

As shown in FIG. 4, a substrate 803 can be loaded through an opening 808 and placed on the pedestal 802. Plasma system 800 comprises an inlet to input one or more process gases 812 through a mass flow controller 811 to a plasma source 813. A plasma source 813 comprising a showerhead 814 is coupled to the processing chamber 801 to receive one or more process gases 812 to generate plasma. Plasma source 813 is coupled to a RF source power 810. Plasma source 813 through showerhead 814 generates a plasma 815 in processing chamber 801 from one or more process gases 812 using a high frequency electric field. Plasma 815 comprises plasma particles, such as ions, electrons, radicals, or any combination thereof. In an embodiment, power source 810 supplies power from about 50W to about 3000W at a frequency from about 400 kHz to about 162 MHz to generate plasma 815.

A plasma bias power 805 is coupled to the pedestal 802 (e.g., cathode) via a RF match 807 to energize the plasma.

In an embodiment, the plasma bias power 805 provides a bias power that is not greater than 1000 W at a frequency between about 2 MHz to 60 MHz, and in a particular embodiment at about 13 MHz. A plasma bias power 806 may also be provided, for example, to provide another bias power that is not greater than 1000 W at a frequency from about 400 kHz to about 60 MHz, and in a particular embodiment, at about 60 MHz. Plasma bias power 806 and plasma bias power 805 are connected lo RF match 807 to provide a dual frequency bias power. In an embodiment, a total bias power applied to the pedestal 802 is from about 10 W to about 3000W.

As shown in FIG. 4, a pressure control system 809 provides a pressure to processing chamber 801. The chamber 801 has one or more exhaust outlets 816 to evacuate volatile products produced during processing in the chamber. In an embodiment, the plasma system 800 is an inductively coupled plasma (ICP) system. In an embodiment, the plasma system 800 is a capacitively coupled plasma (CCP) system.

In some embodiments, a control system 817 is coupled to the processing chamber 801. The control system 817 comprises a processor 818, a temperature controller 819 coupled to the processor 818, a memory 820 coupled to the processor 818, and input/output devices 821 coupled to the processor 818. The memory 820 can include one or more of transitory memory (e.g., random access memory) and non-transitory memory (e.g., storage).

In one embodiment, the processor 818 has a configuration to control one or more of: exposing a substrate in the processing chamber to a hafnium precursor; purging of a substrate in the processing chamber, exposing a substrate in the processing chamber to a dopant precursor, or forming a thin film comprising less than or equal to about 50 monolayers of $HfO_2$ doped with a dopant on a substrate.

The control system 817 can be configured to perform at least some of the methods as described herein and may be either software or hardware or a combination of both. The plasma system 800 may be any type of high performance processing plasma systems known in the art, such as but not limited to an etcher, a cleaner, a furnace, or any other plasma system to manufacture electronic devices.

Figure 5:
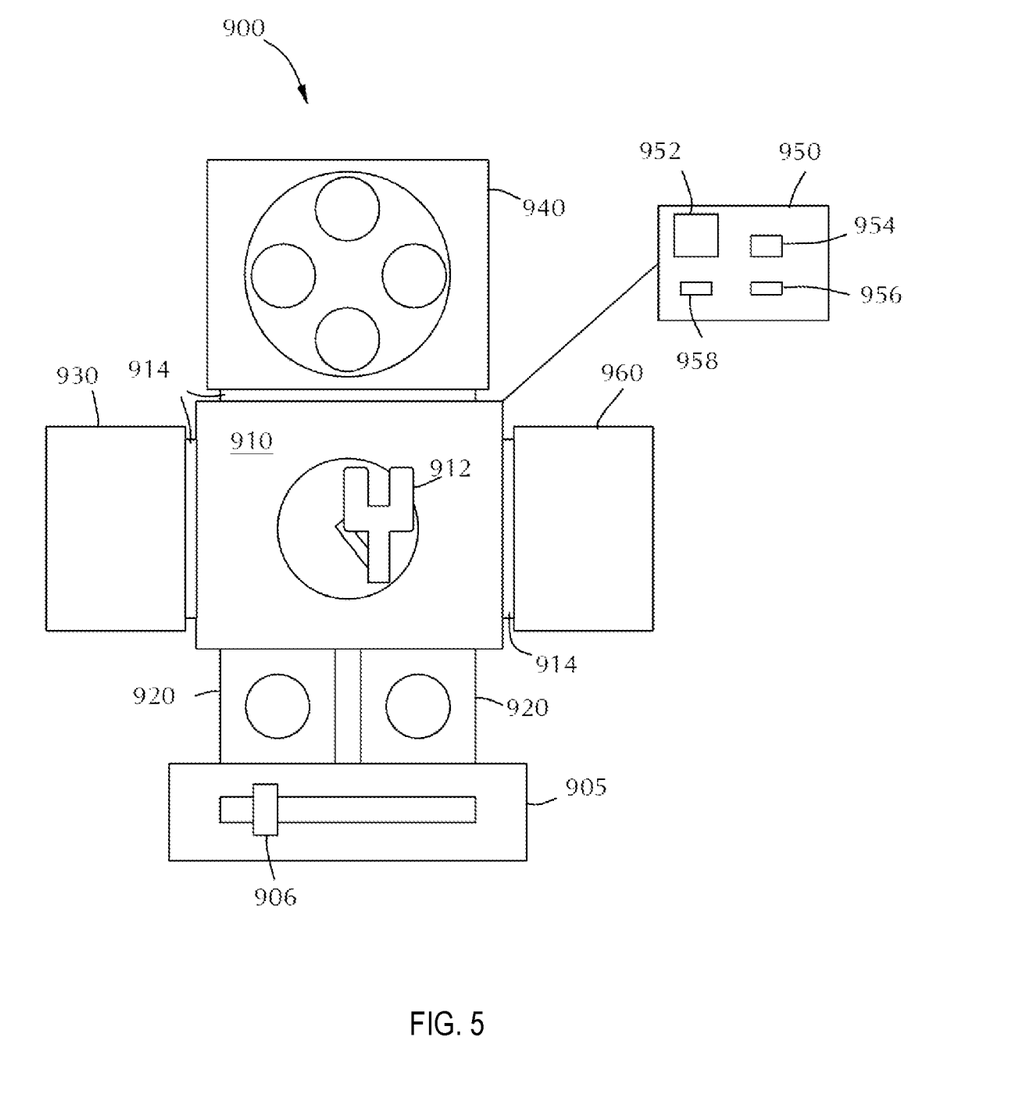
FIG. 5 is a block diagram of a cluster tool system in accordance with one or more embodiment of the disclosure.

FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean chamber 920 is connected to the central transfer station 910. The pre-clean chamber 920 can include one or more of a heater, a radical source or plasma source. The pre-clean chamber 920 is in fluid communication with an activating agent. An exemplary pre-clean chamber 920 is illustrated in FIG. 4 as a plasma system 800.

In some embodiments, there are two pre-clean chambers 920 connected to the central transfer station 910. In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean chamber 920.

The robot 912 can them move the substrate from the pre-clean chamber 920 to other chambers within the system 900.

A deposition chamber 930 can be connected to the central transfer station 910. The deposition chamber 930 comprising a pedestal to hold a substrate. The deposition chamber 930 is in fluid communication with one or more reactive gas sources to provide one or more flows of reactive gases to the deposition chamber 930. The reactive gases of the deposition chamber include the molecule that can form the monolayer on the substrate.

The deposition chamber 930 can be any suitable chamber that can provide a flow of molecules and control the temperature of the substrate. The plasma system 800 shown in FIG. 4 can also be used as the deposition chamber 930. The substrate can be moved to and from the deposition chamber 930 by the robot 912 passing through isolation valve 914.

A selective deposition chamber 940 can also be connected to the central transfer station 910. The selective deposition chamber 940 can be any suitable deposition chamber including, but not limited to, CVD, ALD, PECVD, PEALD, or PVD chambers. In some embodiments, the selective deposition chamber 940 comprises an ALD chamber. The ALD chamber can be a time-domain chamber where the reactive gases are sequentially exposed to the substrate so that only one reactive gas is present in the chamber at any given time. In some embodiments, the ALD chamber is a spatial ALD chamber with the reactive gases are flowed into separate regions of the processing chamber at the same time and the reactive gases are separated by a gas curtain to prevent gas phase reactions between the reactive gases. In a spatial ALD chamber, the substrate is moved between regions of the processing chamber containing the various reactive gases to deposit a film.

Other process chambers can be connected to the central transfer station 910. In the embodiment shown, an ashing chamber 960 is connected to the central transfer station 910 through isolation valve 914. The ashing chamber 960 can be any suitable chamber that can remove the thin film after selective deposition.

At least one controller 950 is coupled to the central transfer station 910, the pre-clean chamber 920, the deposition chamber 930, the selective deposition chamber 940, or the ashing chamber 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:
1. A method of depositing a film, the method comprising:
a first deposition cycle comprising:
exposing a substrate in a processing chamber to a hafnium precursor to deposit a hafnium-containing monolayer,
purging the processing chamber of the hafnium precursor,
exposing the substrate to a first oxidant to react with the hafnium-containing monolayer to form a hafnium oxide monolayer,
purging the processing chamber of the first oxidant;
a second deposition cycle comprising:
exposing the substrate in a processing chamber to a hafnium precursor to deposit a second hafnium-containing monolayer on the hafnium oxide monolayer,
purging the processing chamber of the hafnium precursor;
exposing the substrate to a dopant precursor to deposit a dopant-containing layer on the substrate with the second hafnium-containing monolayer, the dopant-containing layer having a dopant concentration less than 100% dopant,
purging the processing chamber of the dopant precursor,
exposing the substrate to a second oxidant to react with the second hafnium-containing monolayer and the dopant-containing layer to form a doped hafnium oxide film on the substrate, and
purging the processing chamber of the second oxidant; and
repeating one or more of the first deposition cycle or the second deposition cycle so that the doped hafnium oxide film has a thickness in a range of from 0.5 nm to 10 nm, has less than or equal to 150 total monolayers, wherein the dopant concentration is changed in each monolayer and is adjustable in increments of 1.5 mol % so that the doped hafnium oxide film has a dopant concentration in a range of about 1.5 mol % to about 9 mol %.

2. The method of claim 1, wherein the dopant is selected from one or more of aluminum (Al), silicon (Si), zirconium (Zr), yttrium (Y), lanthanum (La), gadolinium (Gd), or strontium (Sr).

3. The method of claim 1, wherein the hafnium precursor is selected from one or more of tetrakis(ethylmethylamido) hafnium (IV) (TEMAHf), tetrakis (dimethylamido)hafnium (IV) (TDMAHf), tetrakis(diethylamido)hafnium(IV) (TDEAHf), hafnium tetrachloride (HfCl$_4$), hafnium isopropoxide isopropanol adduct, hafnium (IV) tert-butoxide, dimethylbis(cyclopentadienyl)hafnium (IV), bis(trimethylsily) amidohafnium (IV)chloride, bis(methyl-η$^5$-cyclopentadienyl) methoxymethylhafnium, or bis(methyl-η$^5$-cyclopentadienyl)dimethylhafnium.

4. The method of claim 1, wherein the dopant precursor is selected from one or more of trimethylaluminum (TMA), triethylaluminum(TEA), aluminum chloride (AlCl$_3$), silicon tetrachloride (SiCl$_4$), hexachlorodisilane (Si$_2$Cl$_6$), bis(diethylamino)silane, tris(dimethylamino)silane, tris(isopropylcyclopentadienyl)lanthanum, tris(2,2,6,6-tetramethyl-3,5-heptanedionato)lanthanum (III) (La(thd)$_3$), tris (cyclopentayldienyl)lanthanum(III) (LaCp$_3$), tris (isopropylcyclopentadienyl)lanthanum(III) (La(CpiPr)$_3$), tetrakis(ethylmethylamido)zirconium(IV) (TEMAZr), tetrakis(dimethylamido) zirconium(IV) (TDMAZr), tetrakis(2,2, 6,6,-tetramethyl-3,5-heptanedionate)zirconium, zirconium (IV) 2-ethylhexanoate, zirconium(IV) dibutoxide(bis-2,4-pentanedionate), tetrakis(diethylamido)zirconium(IV) (TDEAZr), dimethyl-bis(pentamethylcyclopentadienyl)zirconium(IV), bis(methyl-η5-cyclopentadienyl) methoxymethylzirconium, bis(cyclopentadienyl)zirconium(IV) dihydride, zirconium tetrachloride (ZrCl$_4$), tris (cyclopentyldienyl)yttrium(III) (YCp$_3$), tris (methylcyclopentadienyl)yttrium(III) ((MeCp)$_3$Y), tris (ethylcyclopentadienyl)yttrium(III) ((EtCp)$_3$Y), tris(2,2,6,6-tetramethyl-3,5-heptanedionato)yttrium (III) (Y(thd)$_3$), tris (2,2,6,6-tetramethyl-3,5-heptanedionato)gadolinium(III) (Gd(thd)$_3$), tris(methylcyclopentadienyl) gadolinium (III) ((MeCp)$_3$Gd), tris(ethylcyclopentadienyl)gadolinium(III) ((EtCp)$_3$Gd), bis(triisopropylcyclopentadienyl)strontium(II) ((i-Pr$_3$Cp)$_2$Sr), bis(trimethyl-n-propylcyclopentadienyl) strontium(II) ((n-PrMe$_3$Cp)$_2$Sr), or bis(methylcyclopentadienyl) strontium(II) (Sr(thd)$_2$).

5. The method of claim 1, wherein the first oxidant and the second oxidant are independently selected from H$_2$O, molecular oxygen (O$_2$), ozone (O$_3$), direct O$_2$ plasma, or remote O$_2$ plasma.

6. The method of claim 1, wherein purging the processing chamber comprises flowing a purge gas over the substrate.

7. The method of claim 6, wherein the purge gas is selected from one or more of Ar, N$_2$, or He.

8. The method of claim 1, wherein the substrate comprises one or more of silicon, SiO$_2$, Ge, SiGe, MoS$_2$, MoSe$_2$, WS$_2$, WSe$_2$, TiN, TaN, Pt, Ir, or W.

9. A method of depositing a thin film, the method comprising:
forming a hafnium oxide monolayer in a first process cycle comprising sequential exposure of a substrate to a hafnium precursor, purge gas, first oxidant and purge gas;
forming a doped hafnium oxide monolayer on the hafnium oxide monolayer in a second process cycle comprising sequential exposure of the substrate to the hafnium precursor, purge gas, dopant precursor comprising aluminum (Al), purge gas, second oxidant and purge gas, the doped hafnium oxide monolayer having a dopant concentration less than 100% aluminum (Al); and
repeating one or more of the first process cycle or the second process cycle to form an aluminum-doped hafnium oxide film, the aluminum-doped hafnium oxide film having a thickness in a range of from about 0.5 nm to about 10 nm, having less than or equal to 150 total monolayers, wherein the dopant concentration is changed in each monolayer and is adjustable in increments of 1.5 mol % so that the aluminum-doped hafnium oxide film has a dopant concentration in a range of about 1.5 mol % to about 9 mol %.

10. The method of claim 9, wherein the hafnium precursor is selected from one or more of tetrakis(ethylmethylamido) hafnium(IV), (TEMAHf), tetrakis(dimethylamido)hafnium (IV) (TDMAHf), tetrakis(diethylamido)hafnium(IV) (TDEAHf), hafnium isopropoxide isopropanol adduct, hafnium (IV) tert-butoxide, dimethylbis(cyclopentadienyl)hafnium (IV), bis(trimethylsily)amidohafnium (IV) chloride, bis(methyl-η$^5$-cyclopentadienyl)methoxymethylhafnium, bis(methyl-η$^5$-cyclopentadienyl)dimethylhafnium.

11. The method of claim 9, wherein the dopant precursor is selected from one or more of trimethylaluminum (TMA), triethylaluminum (TEA), and aluminum chloride (AlCl$_3$).

12. The method of claim 9, wherein the first oxidant and the second oxidant are selected from $H_2O$, molecular oxygen ($O_2$), ozone ($O_3$), direct $O_2$ plasma, or remote $O_2$ plasma.

13. The method of claim 9, wherein the purge gas is selected from one or more of Ar, $N_2$, or He.

14. The method of claim 9, wherein the aluminum-doped hafnium oxide film has a thickness in a range of from 0.5 nm to 2 nm and has less than or equal to 30 total monolayers.

15. The method of claim 1, wherein the doped hafnium oxide film has a thickness in a range of from 0.5 nm to 2 nm and has less than or equal to 30 total monolayers.

16. The method of claim 10, wherein the hafnium precursor comprises tetrakis(ethylmethylamido)hafnium(IV) (TEMAHf).

17. The method of claim 11, wherein the dopant precursor is selected from one or more of triethylaluminum (TEA) and aluminum chloride ($AlCl_3$).

* * * * *